United States Patent
Yamakawa et al.

(10) Patent No.: US 8,111,110 B2
(45) Date of Patent: Feb. 7, 2012

(54) LOW-NOISE VOLTAGE CONTROLLED OSCILLATOR

(75) Inventors: Junichiro Yamakawa, Chitose (JP); Kazuo Akaike, Chitose (JP); Takashi Nakaoka, Sayama (JP); Mikio Takano, Toshima (JP); Yuichiro Arai, Chichibu (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 94 days.

(21) Appl. No.: 12/585,685

(22) Filed: Sep. 22, 2009

(65) Prior Publication Data
US 2010/0073101 A1    Mar. 25, 2010

(30) Foreign Application Priority Data
Sep. 22, 2008 (JP) ............... P. 2008-242485

(51) Int. Cl.
*H03B 5/08* (2006.01)
(52) U.S. Cl. ........... 331/167; 331/117 R; 331/116 R; 331/177 V
(58) Field of Classification Search ........... 331/16, 331/167, 116 R, 116 FE, 177 V
See application file for complete search history.

(56) References Cited

U.S. PATENT DOCUMENTS
6,836,189 B2 * 12/2004 Scott .............. 331/117 FE

FOREIGN PATENT DOCUMENTS
| JP | H01-169806 | 11/1989 |
|----|-----------|---------|
| JP | 05-211409 | 8/1993 |
| JP | 2001-320236 | 11/2001 |
| JP | 2004-304667 | 10/2004 |
| JP | 2006-135829 | 5/2006 |
| JP | 2007-159114 | 6/2007 |

* cited by examiner

*Primary Examiner* — Arnold Kinkead
(74) *Attorney, Agent, or Firm* — Jacobson Holman PLLC (57) ABSTRACT

A low-noise voltage controlled oscillator is provided, to improve a phase noise characteristic and widen a frequency variable range. The low-noise voltage controlled oscillator is configured so that an oscillation element and a capacitor 2 are connected in series between a collector C and an emitter E of a transistor 1, capacitors 3 and 4 are connected in series between the collector C and the emitter E, an electrical potential between the capacitors 3 and 4 is applied to a base B of the transistor 1; a one-port circuit 6 is provided between the collector C and the capacitor 4; and a capacitor for correction 5 is connected in parallel with the capacitors 3 and 4. The one-port circuit 6 includes a tuned circuit provided with a variable capacitor adjusting a capacity thereof smaller and an inductor adjusting a value of inductance larger so as to set a value of impedance relatively large.

10 Claims, 7 Drawing Sheets

LOW-NOISE VOLTAGE CONTROLLED OSCILLATOR

This application has a priority of Japanese no. 2008-242485 filed Sep. 22, 2008, hereby incorporated by reference.

BACKGROUND OF THE INVENTION

1. Field of the Invention

The present invention relates to a low-noise voltage controlled oscillator with a wide frequency variable range, and more particularly relates to a low-noise voltage controlled oscillator capable of improving a phase noise characteristic over a tuning bandwidth.

2. Description of the Related Art

Conventionally, as a multichannel/multi-access wireless communication method, a phase locked loop (PLL) frequency synthesizer has been widely used from the viewpoint of frequency stability.

A feedback oscillator, for example, is widely used, which can achieve relatively easily a stable output frequency in synchronization with a reference oscillatory frequency.

As the feedback oscillator, a voltage controlled oscillator (VCO) is widely known, which is small in size and operates with low power consumption.

Recent years, since the tendency to convey much information more speedily has been accelerated, a wireless frequency band of a wireless transmission device has been expanded to a frequency band of super high frequency (SHF) or higher, and further has developed to have multiphase and multivalue from the viewpoint of frequency efficiency, so that Quadrature Phase Shift Keying (QPSK), Quadrature Amplitude Modulation (16QAM), 64QAM, 256QAM, 1024QAM and the like are now being steadily brought into practical use.

Particularly, for various modem methods such as orthogonal frequency division multiplexing (OFDM), since a higher-purity signal source satisfying an error vector magnitude (EVM) characteristic has been increasingly requested to maintain modulation accuracy, an unprecedented low-phase noise characteristic is demanded.

As is well known, as for a higher-purity VCO, a low phase noise VCO is demanded, to which a low noise transistor or a transistor with a low corner frequency and a low cross modulation product is applied, in order to increase an effective load QL of a resonator making up an oscillator.

Regarding these characteristics, a surface acoustic wave (SAW) resonator or a high-dielectric reentrant resonator is generally used for a VCO with a relatively narrow variable frequency range, e.g., a few % or less, for example. However, since a variable frequency of a SAW resonator has a large capacity ratio, it is difficult to obtain a variable range of 1% or more therefrom in general.

Meanwhile, a dielectric resonator is known to have a relatively high Q and is widely applied to a high-purity VCO resonator. A high dielectric reentrant resonator (CAVITY), however, has a feature of reducing an electrical length because of a relatively high dielectric constant (Er) thereof, thus enabling miniaturization, while suppressing a variable range for a general "fixed L and variable C" VCO because characteristic impedance Zo is lowered to $1/\sqrt{Er}$, thus inevitably leading to Q deterioration.

In general, from the viewpoint of an increase in a frequency variable range, high characteristic impedance $Zo=\sqrt{(L/C)}$ is required to be set in principle. However, it is widely known that a frequency variable range of a VCO and a low-phase noise characteristic have a tradeoff relationship.

Herein, related prior art includes Japanese Patent Application Laid-Open No. 2007-159114 (Applicant: Synergy Microwave Corporation) (Patent Document 1), Japanese Patent Application Laid-Open No. H05 (1993)-211409 (Applicant: Mitsubishi Electric Corporation) (Patent Document 2), and Japanese Patent Application Laid-Open No. 2004-304667 (Applicant: Toyo Communication Equipment Co., Ltd.) (Patent Document 3).

Patent Document 1 describes a piezoelectric controlled oscillator with multi-octave frequency band selectivity while keeping relatively low and uniform phase noise over a tuning bandwidth.

More specifically, the piezoelectric controlled oscillator is configured so that a multimode coupled resonator is coupled between a base and a collector of a bipolar transistor via a controllable capacitive element and a slow-wave coupled resonator and a progressive-wave coupled resonator are coupled in series with the collector of the transistor.

Patent Document 2 describes a voltage controlled oscillator with low phase noise and a wide tuning range.

More specifically, it describes a piezoelectric controlled oscillator including an oscillator such as a bipolar transistor loaded with two tuned circuits, where the tuned circuits are configured so that a parallel resonance circuit is connected with a series circuit consisting of a varactor diode and an inductor via a line with an electrical length of about 90 degrees in the vicinity of the oscillatory frequency.

Patent Document 3 describes a piezoelectric oscillator achieving a stable oscillatory frequency by stabilizing a base input of an oscillation transistor so as to reduce an influence by fluctuation of a power source.

More specifically, the piezoelectric oscillator includes a parallel circuit of a resistor and a capacity inserted between an emitter of an oscillating amplification transistor and ground and a FET amplifying an output signal of the piezoelectric oscillator, where a collector of the oscillating amplification transistor is connected with a gate of a FET via a capacity and a source of the FET is grounded via a resistor so that a source potential of the FET is applied to a base of the oscillating amplification transistor.

The above-stated conventional piezoelectric controlled oscillators, however, are provided with a simple variable tuned circuit, and a dielectric constant of a dielectric resonator making up a variable tuner thereof is relatively high, for example, about 10 to 90, although it depends on the applied frequency band. Therefore, characteristic impedance Zo is lowered to 0.1 to 0.3 time, so that Zo and an equivalent inductor are significantly reduced, thus causing extreme reduction of QL due to a variable capacity C, which leads to the difficulty to achieve a higher-purity voltage controlled oscillator with a relatively wide frequency variable range.

SUMMARY OF THE INVENTION

In view of the above-stated circumstances, it is an object of the present invention to provide a low-noise voltage controlled oscillator capable of improving a phase noise characteristic while widening a frequency variable range.

In order to cope with the above-stated problems of conventional examples, a low-noise voltage controlled oscillator of the present invention provided with an oscillation element that oscillates an oscillatory frequency; and a transistor that keeps the oscillatory frequency and has a negative resistance, the low-noise voltage controlled oscillator having a frequency variable range. The low-noise voltage controlled oscillator includes: a first capacity and a second capacity connected in series between a collector and an emitter of the transistor; a third capacity connected in series between the collector and the emitter to be in parallel with the first and the second capacities connected in series, an electrical potential between the first and the second capacities being applied to a base of the transistor; a one-port circuit provided between the collector and the first capacity; and a capacity for correction connected in parallel with the first and the second capacities connected in series. The one-port circuit includes a tuned circuit including a variable capacitor capable of adjusting a capacity thereof smaller and an inductor capable of adjusting a value of inductance larger so as to increase a value of impedance. Thus, the low-noise voltage controlled oscillator has an effect of improving a phase noise characteristic while widening a frequency variable range.

Further, according to the present invention, in the above-stated low-noise voltage controlled oscillator, the one-port circuit includes a direct-coupled single tuned circuit configured so that a variable capacitor and an inductor are connected in parallel between a terminal on a side of the collector and a terminal on a side of the first capacity, a capacity of the variable capacitor being variable by a control voltage.

Further, according to the present invention, in the above-stated low-noise voltage controlled oscillator, the one-port circuit includes an inductively-coupled single tuned circuit configured so that a first inductor is connected between a terminal on a side of the collector and a terminal on a side of the first capacity, and a second inductor inductively coupling with the first conductor and a variable capacitor are connected in parallel, a capacity of the variable capacitor being variable by a control voltage.

Further, according to the present invention, in the above-stated low-noise voltage controlled oscillator, the one-port circuit includes an inductively-coupled multiple tuned circuit including: a first inductor connected between a terminal on a side of the collector and a terminal on a side of the first capacity; a first circuit including a second inductor inductively coupling with the first conductor and a first variable capacitor whose capacity is variable by a control voltage connected in parallel; and a second circuit including a third inductor inductively coupling with the first conductor and a second variable capacitor whose capacity is variable by a control voltage connected in parallel.

Further, according to the present invention, the above-stated low-noise voltage controlled oscillator includes a composite-coupled multiple tuned circuit configured so that the first circuit and the second circuit are connected via a first capacitor and a second capacitor connected in series.

Further, according to the present invention, in the above-stated low-noise voltage controlled oscillator, the one-port circuit includes Lecher wire or microstrip line as an inductor, and includes crystal substrate, transparent quartz glass, or single crystal sapphire.

DESCRIPTION OF REFERENCE NUMERALS

1 Three-terminal transistor
2 Capacitor (C2)
3 Capacitor (C3)
4 Capacitor (C4)
5 Capacitor for correction (C5)
6 One-port circuit
61 Variable capacitor (C61)
62 Inductor (L62)
611 Variable capacitor (C611)
612 Inductor (L612)
613 Inductor (L613)
614 Inductor (L614)
615 Variable capacitor (C615)
616 Capacitor (C616)
617 Capacitor (C617)

DESCRIPTION OF THE PREFERRED EMBODIMENT

The following describes embodiments of the present invention with reference to the drawings.

Summary of Embodiments

A low-noise voltage controlled oscillator according to one embodiment of the present invention includes: an oscillation element; a first capacity and a second capacity connected in series between a collector and an emitter of a transistor; a third capacity connected in series between the collector and the emitter to be in parallel with the first and the second capacities connected in series, an electrical potential between the first and the second capacities being applied to a base of a transistor 1; a one-port circuit provided between the collector and the first capacity; and a capacity for correction connected in parallel with the first and the second capacities connected in series. The one-port circuit includes a tuned circuit provided with a variable capacitor capable of adjusting a capacity thereof smaller and an inductor capable of adjusting a value of inductance larger so as to increase a value of impedance. This configuration allows a phase noise characteristic to be improved, while widening a frequency variable range, thus enabling miniaturization with low power consumption.

Figure 1:
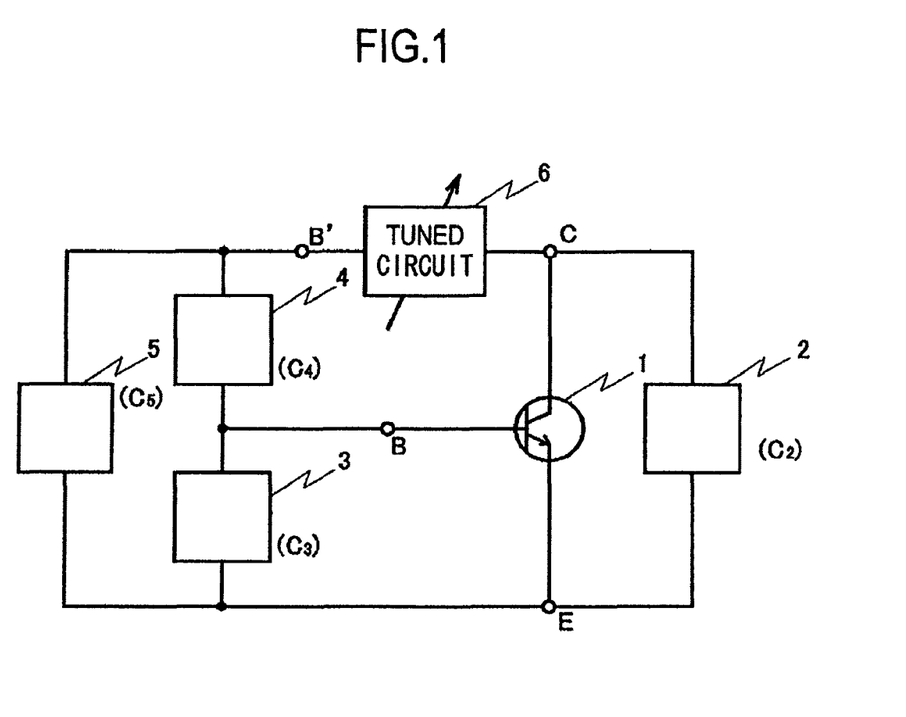
FIG. 1 illustrates the configuration of a low-noise voltage controlled oscillator according to one embodiment of the present invention.

[Voltage Controlled Oscillator: FIG. 1]

Referring to FIG. 1, a low-noise voltage controlled oscillator according to one embodiment of the present invention is described below. FIG. 1 illustrates the configuration of a low-noise voltage controlled oscillator according to one embodiment of the present invention.

In this embodiment of the present invention, the drawing illustrates, as a passive element, a capacitor or a capacitor of a variable capacity diode, or an inductor of a coil.

Note here that an oscillation element and a third capacity in claims correspond to a capacitor 2 in this embodiment, a first capacity corresponds to a capacitor 4, a second capacity corresponds to a capacitor 3, a capacity for correction corresponds to a capacitor for correction 5, a first inductor corresponds to an inductor 613, a second inductor corresponds to an inductor 612, a third inductor corresponds to an inductor 614, a first variable capacitor corresponds to a variable capacitor 611, a second variable capacitor corresponds to a variable capacitor 615, a first capacitor corresponds to a capacitor 616, and a second capacitor corresponds to a capacitor 617.

A low-noise voltage controlled oscillator according to one embodiment of the present invention (the present oscillator) includes, as illustrated in FIG. 1, a three-terminal transistor 1, a capacitor (C2) 2 provided between a collector C and an emitter E of the transistor 1, a capacitor (C3) 3 provided between a base B and the emitter E of the transistor 1, and a capacitor (C4) 4 provided between the collector C and the base B of the transistor 1, and further includes a one-port circuit 6 between the collector C of the transistor 1 and the capacitor (C4) 4, and a capacitor for correction (C5) 5 connected in parallel with the capacitor 3 and the capacitor 4 connected in series.

Herein, in this circuit, the one-port circuit 6 has a configuration of increasing inductance L and reducing a capacitance C so as to increase impedance Zo, thus enabling reduction of phase noise even when a frequency is made variable.

The specific configuration of the one-port circuit 6 will be described later.

This circuit is further provided with the capacitor for correction 5 that corrects a feedback amount. This capacitor for correction 5 is set depending on a characteristic of the one-port circuit 6 in order to correct a feedback amount when a tuner of the one-port circuit 6 is provided, which will be described later. The thus set capacitor for correction 5 allows the oscillation circuit as a whole to be stabilized.

Referring now to FIGS. 2 to 5, a tuner of the one-port circuit 6 is described below. The tuner may include a direct-coupled single tuned circuit illustrated in FIG. 2, an inductively-coupled single tuned circuit illustrated in FIG. 3, an inductively-coupled multiple tuned circuit illustrated in FIG. 4, and a composite-coupled multiple tuned circuit illustrated in FIG. 5.

Figure 2:
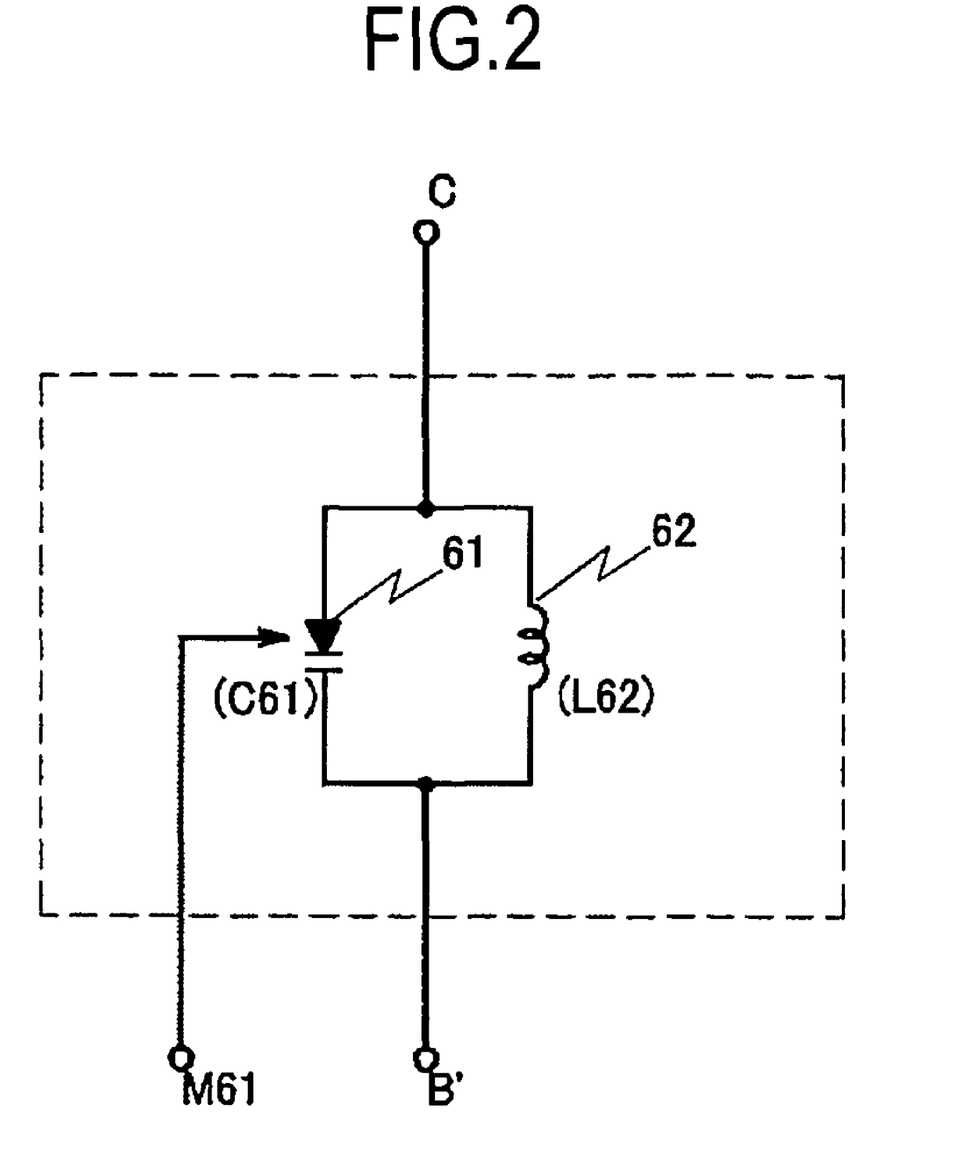
FIG. 2 is a circuit diagram illustrating an exemplary direct-coupled single tuned circuit.

[Direct-Coupled Single Tuned Circuit: FIG. 2]

The direct-coupled single tuned circuit will be described more specifically, with reference to FIG. 2. FIG. 2 is a circuit diagram illustrating an exemplary direct-coupled single tuned circuit.

The direct-coupled single tuned circuit as a one-port circuit in FIG. 2 is a single tuned circuit coupled directly, including a variable capacitor (C61) 61 of a variable-capacity diode and an inductor (L62) 62 of a coil, where the variable capacitor 61 changes in accordance with a control voltage applied to a control voltage terminal M61. The control voltage is applied externally.

Terminals B' and C of the port circuit 6 of FIG. 2 are connected with terminals B' and C of FIG. 1, respectively.

In the configuration of FIG. 2, the inductance L can be increased and the capacitance C can be decreased, thus enabling an increase of Q.

Figure 3:
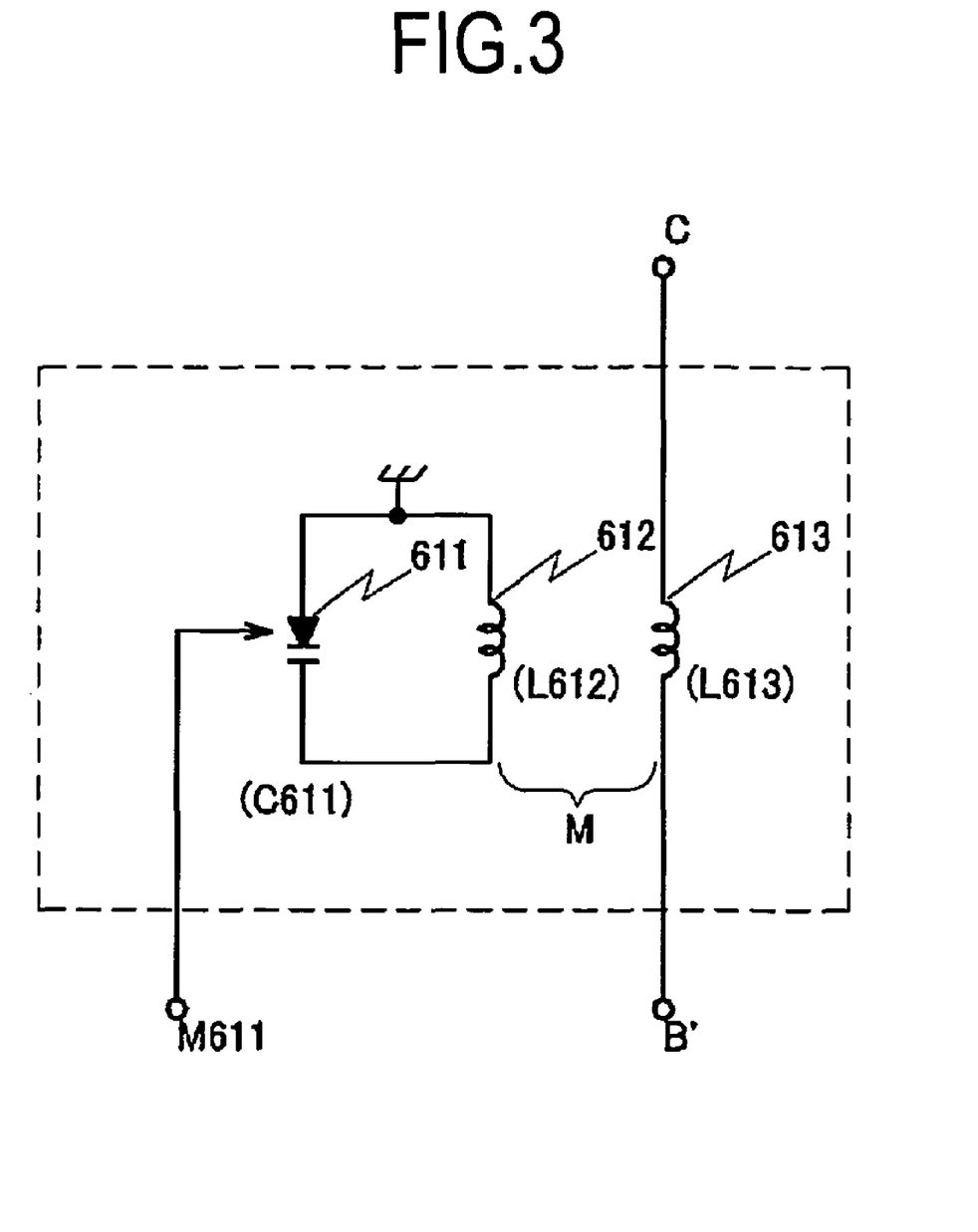
FIG. 3 is a circuit diagram illustrating an exemplary inductively-coupled single tuned circuit.

[Inductively-Coupled Single Tuned Circuit: FIG. 3]

The inductively-coupled single tuned circuit will be described more specifically, with reference to FIG. 3. FIG. 3 is a circuit diagram illustrating an exemplary inductively-coupled single tuned circuit.

The inductively-coupled single tuned circuit as a one-port circuit in FIG. 3 is a single tuned circuit coupled inductively, including a variable capacitor (C611) 611 of a variable-capacity diode, an inductor (L612) 612 of a coil connected in parallel with the variable capacitor 611, and a inductor (L613) 613 of a coil inductively-coupled (M) with the inductor 612. An anode side of the variable-capacity diode is grounded.

The variable capacitor 611 varies in accordance with a control voltage applied to a control voltage terminal M611. The control voltage is applied externally.

The inductor 613 conveys energy to the inductor 612 by inductive coupling (M).

Terminals B' and C of the one-port circuit 6 of FIG. 3 are connected with terminals B' and C of FIG. 1, respectively.

In the configuration of FIG. 3, the capacitor C611 can be decreased, whereas the inductor L612 can be increased because of energy conveyed from the inductor L613 by inductive coupling, and therefore impedance Zo of the one-port circuit 6 can be increased, thus enabling an increase of Q.

Figure 4:
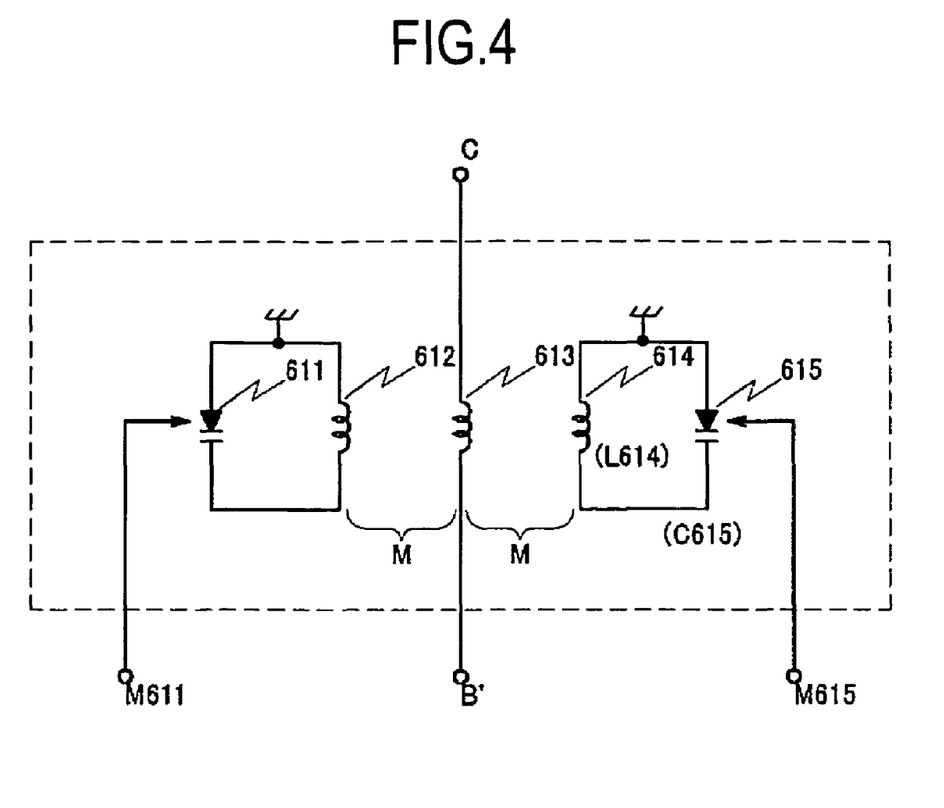
FIG. 4 is a circuit diagram illustrating an exemplary inductively-coupled multiple tuned circuit.

[Inductively-Coupled Multiple Tuned Circuit: FIG. 4]

The inductively-coupled multiple tuned circuit will be described more specifically, with reference to FIG. 4. FIG. 4 is a circuit diagram illustrating an exemplary inductively-coupled multiple tuned circuit.

The inductively-coupled multiple tuned circuit as a one-port circuit in FIG. 4 is a multiple tuned circuit coupled inductively, including a first tuned circuit made up of a variable capacitor (C611) 611 of a variable-capacity diode and an inductor (L612) 612 of a coil connected in parallel with the variable capacitor 611, and a second tuned circuit made up of a variable capacitor (C615) 615 of a variable-capacity diode and an inductor (L614) 614 of a coil connected in parallel with the variable capacitor 615, and an inductor (L613) 613 of a coil inductively-coupled (M) with both of the inductors 612 and 614. An anode side of the variable-capacity diode in each tuned circuit is grounded.

The variable capacitor 611 varies in accordance with a control voltage applied to a control voltage terminal M611. The variable capacitor 615 varies in accordance with a control voltage applied to a control voltage terminal M615. The control voltage is applied externally.

The inductor 613 conveys energy to the inductors 612 and 614 by inductive coupling (M).

Terminals B' and C of the one-port circuit 6 of FIG. 4 are connected with terminals B' and C of FIG. 1, respectively.

In the configuration of FIG. 4, the capacitor C611 can be decreased, whereas the inductors L612 and L614 can be increased because of energy conveyed from the inductor L613 by inductive coupling, and therefore impedance Zo of the one-port circuit 6 can be increased, thus enabling an increase of Q.

Figure 5:
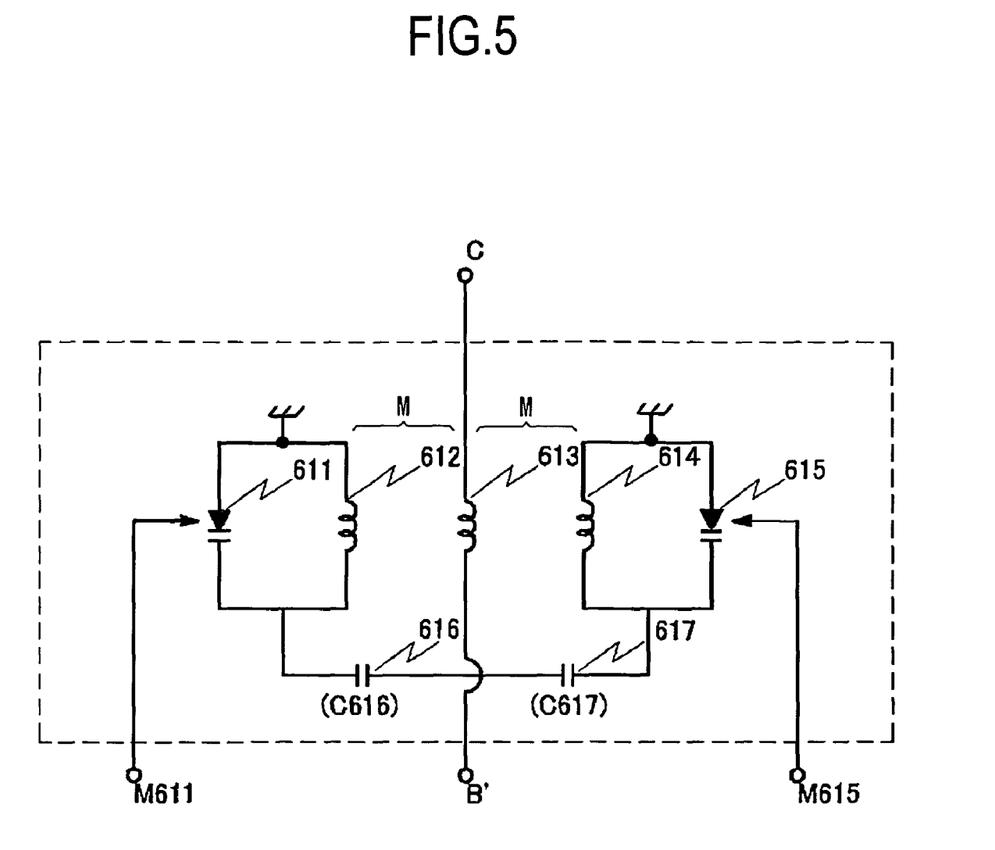
FIG. 5 is a circuit diagram illustrating an exemplary composite-coupled multiple tuned circuit.

[Composite-Coupled Multiple Tuned Circuit: FIG. 5]

The composite-coupled multiple tuned circuit will be described more specifically, with reference to FIG. 5. FIG. 5 is a circuit diagram illustrating an exemplary composite-coupled multiple tuned circuit.

The composite-coupled multiple tuned circuit as a one-port circuit in FIG. 5 is a composite-coupled multiple tuned circuit coupled inductively, including a first tuned circuit made up of a variable capacitor (C611) 611 of a variable-capacity diode and an inductor (L612) 612 of a coil connected in parallel with the variable capacitor 611, a second tuned circuit made up of a variable capacitor (C615) 615 of a variable-capacity diode and an inductor (L614) 614 of a coil connected in parallel with the variable capacitor 615, an inductor (L613) 613 of a coil inductively-coupled (M) with both of the inductors 612 and 614, and capacitors (C616, C617) 616, 617 of two capacitors provided on a line connecting cathode sides of the variable-capacity diodes in the tuned circuits. An anode side of the variable-capacity diode in each tuned circuit is grounded.

The variable capacitor 611 varies in accordance with a control voltage applied to a control voltage terminal M611. The variable capacitor 615 varies in accordance with a control voltage applied to a control voltage terminal M615. The control voltage is applied externally.

The inductor 613 conveys energy to the inductors 612 and 614 by inductive coupling (M).

Terminals B' and C of the one-port circuit 6 of FIG. 5 are connected with terminals B' and C of FIG. 1, respectively.

In the configuration of FIG. 5, the capacitor C611 can be decreased, whereas the inductors L612 and L614 can be increased because of energy conveyed from the inductor L613 by inductive coupling, and therefore impedance Zo of the one-port circuit 6 can be increased, thus enabling an increase of Q.

Further, the first tuned circuit and the second tuned circuit are capacity-coupled by the capacitors 616 and 617, thus enabling composite-coupling including the inductive coupling as well.

Figure 6:
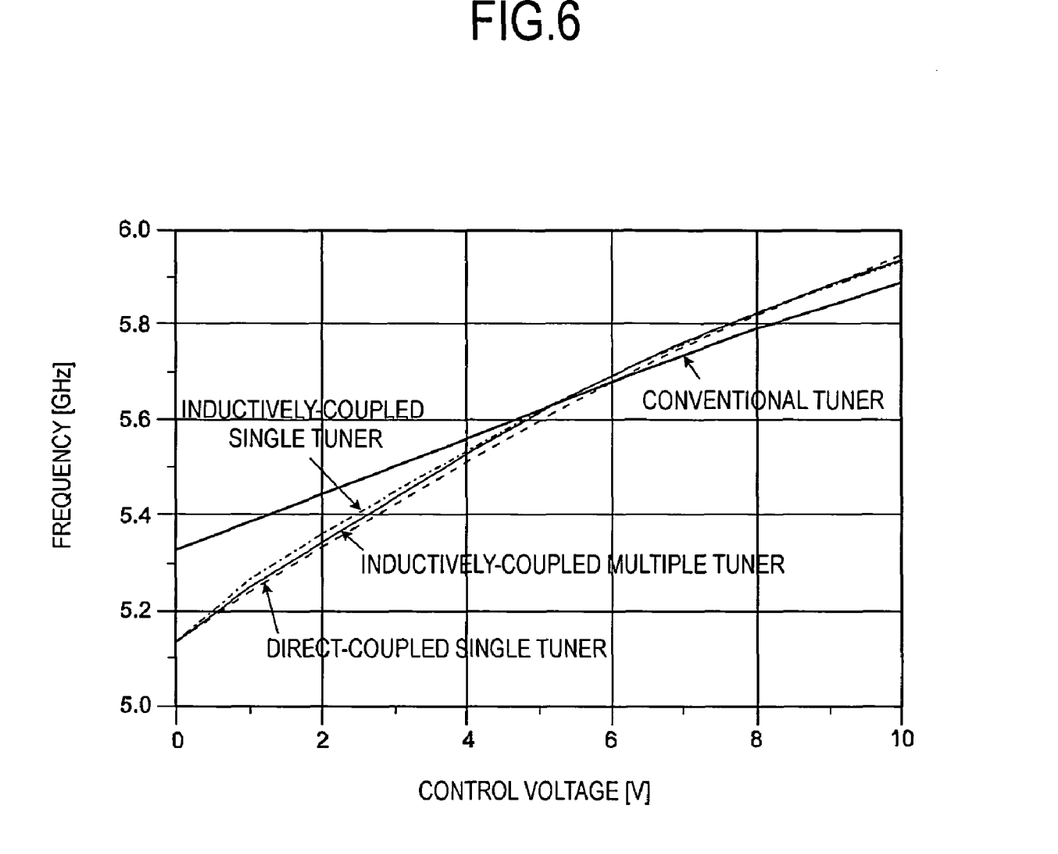
FIG. 6 illustrates control voltage-variable frequency characteristics.

[Control Voltage-Variable Frequency Characteristics: FIG. 6]

Referring now to FIG. 6, control voltage-variable frequency characteristics of the conventional tuned circuit (tuner), the direct-coupled single tuned circuit of FIG. 2 (direct-coupled single tuner), the inductively-coupled single tuned circuit of FIG. 3 (inductively-coupled single tuner), and the inductively-coupled multiple tuned circuit of FIG. 4 (inductively-coupled multiple tuner) will be described below. FIG. 6 illustrates control voltage-variable frequency characteristics.

As illustrated in FIG. 6, the control voltage-variable frequency characteristics of the direct-coupled single tuner, the inductively-coupled single tuner, and the inductively-coupled multiple tuner are adjustable to be substantially similar to each other. However, a variable range of the conventional tuner is small because impedance thereof cannot be made high.

Figure 7:
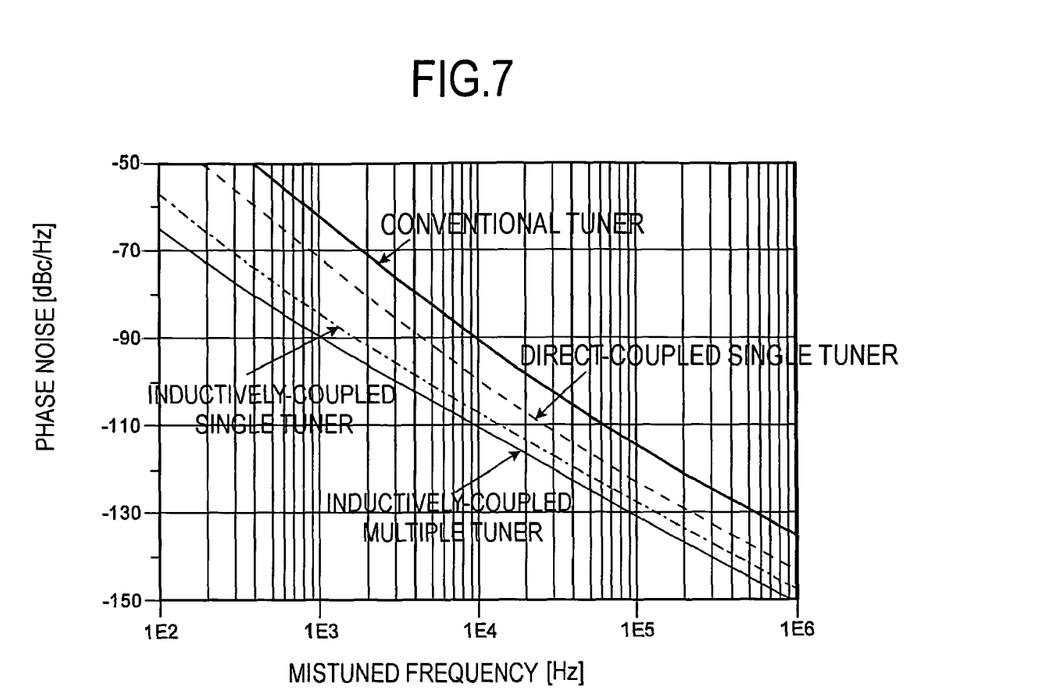
FIG. 7 illustrates phase noise characteristics.

[Phase Noise Characteristics: FIG. 7]

Referring now to FIG. 7, phase noise characteristics of the conventional tuned circuit (tuner), the direct-coupled single tuned circuit of FIG. 2 (direct-coupled single tuner), the inductively-coupled single tuned circuit of FIG. 3 (inductively-coupled single tuner), and the inductively-coupled multiple tuned circuit of FIG. 4 (inductively-coupled multiple tuner) will be described below. FIG. 7 illustrates phase noise characteristics.

As illustrated in FIG. 7, phase noise [dBc/Hz] with reference to a mistuned frequency [Hz] shows favorable values in the order of the conventional tuner, the direct-coupled single tuner, the inductively-coupled single tuner and the inductively-coupled multiple tuner. Particularly, the inductively-coupled single tuner and the inductively-coupled multiple tuner show favorable phase noise characteristics as compared with the conventional tuner.

In order to keep their impedances $Zo=\sqrt{(L/C)}$ high, the above-stated tuned circuits may include as an inductor Lecher wire or microstrip line, for example, of a relatively small dielectric constant, thus maximizing a frequency variable range.

Further, crystal substrate, transparent quartz glass, or single crystal sapphire, for example, may be used for an inductor, which has a relatively small dielectric constant, thus increasing impedance of the oscillation circuit as a whole so as to achieve a high Q value.

Advantages of the Embodiments

As described above in detail, according to the oscillators of the present invention, a resonator enabling relatively high effective QL and a relatively wide variable range can be configured as illustrated in simulation characteristic examples, thus leading to an effect of improving a phase noise characteristic.

Further, according to the oscillators of the present invention, the configurations of the tuned circuits of FIGS. 2 to 5 allow variable capacitors to be changed with a control voltage, while increasing an inductance L, thus leading to an effect of miniaturizing the circuit with low power consumption.

The present invention can be suitably applied to a low-noise voltage controlled oscillator that can improve a phase noise characteristic while widening a frequency variable range.

What is claimed is:

1. A low-noise voltage controlled oscillator provided with an oscillation element that oscillates an oscillatory frequency; and a transistor that keeps the oscillatory frequency and has a negative resistance, the low-noise voltage controlled oscillator having a frequency variable range, comprising:
a first capacity and a second capacity connected in series between a collector and an emitter of the transistor;
a third capacity connected in series between the collector and the emitter to be in parallel with the first and the second capacities connected in series, an electrical potential between the first and the second capacities being applied to a base of the transistor;
a tuned circuit provided between the collector and the first capacity; and
a capacity for correction connected in parallel with the first and the second capacities connected in series,
wherein the tuned circuit includes a variable capacitor capable of adjusting a capacity thereof smaller and an inductor capable of adjusting a value of inductance larger so as to increase a value of impedance.

2. The low-noise voltage controlled oscillator according to claim 1, wherein the tuned circuit comprises a direct-coupled single tuned circuit configured so that a variable capacitor and an inductor are connected in parallel between a terminal on a side of the collector and a terminal on a side of the first capacity, a capacity of the variable capacitor being variable by a control voltage.

3. The low-noise voltage controlled oscillator according to claim 1, wherein the tuned circuit comprises an inductively-coupled single tuned circuit configured so that a first inductor is connected between a terminal on a side of the collector and a terminal on a side of the first capacity, and a second inductor inductively coupling with the first conductor and a variable capacitor are connected in parallel, a capacity of the variable capacitor being variable by a control voltage.

4. The low-noise voltage controlled oscillator according to claim 1, wherein the tuned circuit comprises an inductively-coupled multiple tuned circuit including: a first inductor connected between a terminal on a side of the collector and a terminal on a side of the first capacity; a first circuit including a second inductor inductively coupling with the first conductor and a first variable capacitor whose capacity is variable by a control voltage connected in parallel; and a second circuit including a third inductor inductively coupling with the first conductor and a second variable capacitor whose capacity is variable by a control voltage connected in parallel.

5. The low-noise voltage controlled oscillator according to claim 4, comprising a composite-coupled multiple tuned circuit configured so that the first circuit and the second circuit are connected via a first capacitor and a second capacitor connected in series.

6. The low-noise voltage controlled oscillator according to claim 1, wherein the tuned circuit comprises Lecher wire or microstrip line as an inductor, and comprises crystal substrate, transparent quartz glass, or single crystal sapphire.

7. The low-noise voltage controlled oscillator according to claim 2, wherein the tuned circuit comprises Lecher wire or microstrip line as an inductor, and comprises crystal substrate, transparent quartz glass, or single crystal sapphire.

8. The low-noise voltage controlled oscillator according to claim 3, wherein the tuned circuit comprises Lecher wire or microstrip line as an inductor, and comprises crystal substrate, transparent quartz glass, or single crystal sapphire.

9. The low-noise voltage controlled oscillator according to claim 4, wherein the tuned circuit comprises Lecher wire or microstrip line as an inductor, and comprises crystal substrate, transparent quartz glass, or single crystal sapphire.

10. The low-noise voltage controlled oscillator according to claim 5, wherein the tuned circuit comprises Lecher wire or microstrip line as an inductor, and comprises crystal substrate, transparent quartz glass, or single crystal sapphire.

* * * * *